United States Patent [19]

Leupold

[11] Patent Number: 4,837,542
[45] Date of Patent: Jun. 6, 1989

[54] HOLLOW SUBSTANTIALLY HEMISPHERICAL PERMANENT MAGNET HIGH-FIELD FLUX SOURCE FOR PRODUCING A UNIFORM HIGH FIELD

[75] Inventor: Herbert A. Leupold, Eatontown, N.J.

[73] Assignee: The United States of America as represented by the Secretary of the Army, Washington, D.C.

[21] Appl. No.: 199,500

[22] Filed: May 27, 1988

[51] Int. Cl.$^4$ .............................................. H01F 7/02
[52] U.S. Cl. .................................... 335/306; 315/535; 335/304
[58] Field of Search ............... 335/302, 304, 306, 212; 315/5.24, 5.34, 5.35

[56] References Cited

U.S. PATENT DOCUMENTS

| | | | |
|---|---|---|---|
| 2,952,803 | 9/1960 | Charles et al. | 335/302 |
| 3,768,054 | 10/1973 | Neugebauer | 335/306 X |
| 4,392,078 | 7/1983 | Noble et al. | 315/5.35 X |
| 4,429,229 | 1/1984 | Gluckstern | 335/212 X |
| 4,614,930 | 9/1986 | Hickey et al. | 335/306 X |

OTHER PUBLICATIONS

"Proceedings of the Eighth International Workshop on Rare Cobalt Permanent Magnets," by Klaus Halbach (Univ. Dayton, Dayton, OH 1985) pp. 123–136.

Primary Examiner—George Harris
Attorney, Agent, or Firm—Sheldon Kanars; John K. Mullarney

[57] ABSTRACT

A hollow spherical flux source produces a uniform high-field in its central cavity. The sphere is comprised of a selected magnetic material whose magnetization is aximuthally symmetrical. The magnetic orientation ($\alpha$) in the spherical permanent magnet shell is given by the equation:

$$\alpha = z\theta$$

where $\theta$ is the polar angle.

8 Claims, 2 Drawing Sheets

HOLLOW SUBSTANTIALLY HEMISPHERICAL PERMANENT MAGNET HIGH-FIELD FLUX SOURCE FOR PRODUCING A UNIFORM HIGH FIELD

The invention described herein may be manufactured, used and licensed by or for the Government for governmental purposes without the payment to me of any royalties thereon.

TECHNICAL FIELD

The present invention relates in general to permanent-magnet structures for use in electronic devices and, more particularly, to hollow, substantially spherical, flux sources which produce uniform magnetic fields greater than the remanence of the magnetic material comprising them.

BACKGROUND OF THE INVENTION

Many devices that employ magnetic fields have heretofore been encumbered by massive solenoids with their equally bulky power supplies. Thus, there has been increasing interest in the application of permanent-magnet structures for such uses as electron-beam focusing and biasing fields. The current demand for compact, strong, static magnetic field sources that require no electric power supplies has created needs for permanent magnet structures of unusual form. A number of configurations have been designed and developed for electron-beam guidance in mm/microwave tubes of various types; for dc biasing fields in millimeter wave filters, circulators, isolators, strip-lines; for field sources in NMR (nuclear magnetic resonance) imagers; and so on. Especially promising for such purposes is the configuration based on the hollow cylindrical flux source (HCFS) principle described by K. Halbach, in "Proceedings of the Eighth International Workshop on Rare Earth Cobalt Permanent Magnets" (University of Dayton, Dayton, Ohio, 1985) p. 123-136. A HCFS, sometimes called a "magic ring", is a cylindrical permanent-magnet shell which offers a magnetization vector that is more-or-less constant in magnitude and produces a field greater than the remanence of the magnetic material from which it is made.

The "magic ring" or HCFS concept has proven to be useful for a variety of applications that require relatively high transverse fields in tubular working spaces (e.g., mm/microwave radiation sources and amplifiers). Unfortunately, there are field distortions in the magic ring due to end effects, and to achieve a fairly uniform biasing field the device would have to be wastefully long (i.e., a very large length-to-radius ratio). And, the length necessary to achieve a highly uniform biasing field requires a fairly massive structure.

SUMMARY OF THE INVENTION

It is a primary object of the present invention to achieve a highly uniform biasing field within a very compact structure.

A related object is to achieve a very high magnetic field (e.g., >20 kG.) which is uniform and undistorted (e.g., due to end or other effects).

A further object of the invention is to provide a source(s) for producing a uniform magnetic field greater than the remanence of the magnetic material comprising it and, more specifically, greater than that achievable by a magic ring with the same radius.

The above and other objects are achieved in accordance with the present invention by a hollow (substantially) spherical flux source (HSFS) that produces a uniform high-field in its central cavity. The HSFS or "magic sphere" is comprised of a selected magnetic material and the magnetization is azimuthally symmetrical. The magnetic orientation ($\alpha$) with respect to the polar axis in the spherical permanent magnet shell is equal to $2\theta$ ($\alpha = 2\theta$), where $\theta$ is the polar angle. An axial bore hole through the magnetic poles provides access to the uniform high-field in the central cavity. For some applications, however, a bore hole transverse to the polar axis is desirable.

DETAILED DESCRIPTION

Figure 1:
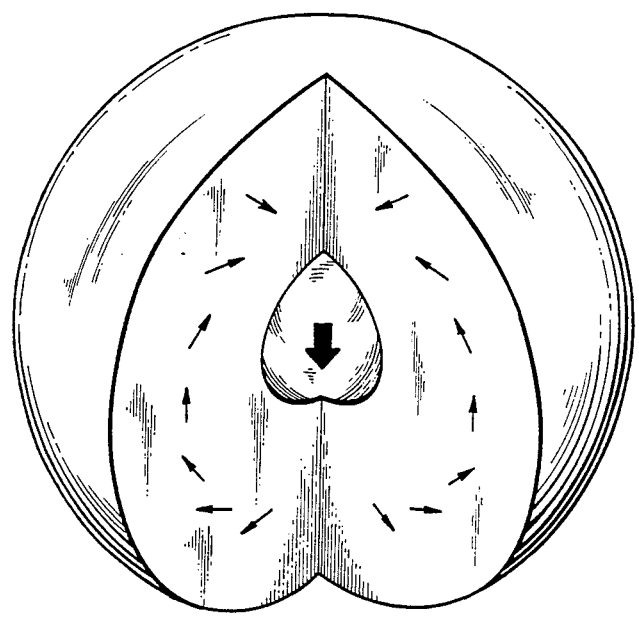
FIG. 1 shows a partially cut-away, ideal spherical flux source.
Figure 5:
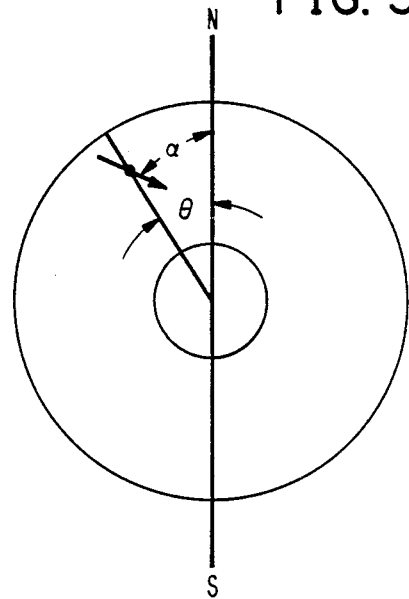
FIG. 5 is a geometric illustration of several terms used in the present description.

FIG. 1 illustrates an ideal, hollow spherical flux source (HSFS) or "magic ring" in accordance with the present invention. The large arrow designates the uniform high-field in the central cavity which, of course, is a spherical hole. The hollow sphere is comprised of magnetic material and its magnetization is azimuthally symmetrical. The small arrows in FIG. 1 indicate the magnetization orientation at various points. The magnetic orientation ($\alpha$) in the spherical permanent magnet shell is given by the equation:

$$\alpha = 2\theta \qquad (1)$$

where $\theta$ is the polar angle. These values ($\alpha\theta$) are shown in the geometric illustration of FIG. 5. The value $\alpha$ is the magnetization angle with respect to the polar axis. One can determine the field at the center of such a configuration by finding the pole densities in the annular shell and on its inner and outer surfaces, inserting those values into Coulomb's equation and integrating over the volume and surfaces of the shell. The volume charge density is given by $$\rho = -\nabla \cdot \vec{M} \qquad (2)$$

and the surface charge densities by $$\sigma = \hat{n} \cdot \vec{M} \qquad (3)$$

where $\hat{n}$ is normal to the surface in question, and $\vec{M}$ is the magnetization vector. We apply Eq. (2) and obtain $$\rho = -\nabla \cdot \vec{M} = -\left[\frac{1}{r^2}\frac{\partial(r^2 M_r)}{\partial r} + \frac{1}{r\sin\theta}\frac{\partial(M_\theta \sin\theta)}{\partial \theta} + \frac{1}{r\sin\theta}\frac{\partial m_\phi}{\partial \phi}\right] \qquad (4)$$

where

-continued $$M_r = M \cos \theta$$
$$M_\theta = M \sin \theta \quad (5)$$
$$M_\phi = 0.$$

If we insert Eq. (5) into Eq. (4), we obtain $$\rho = \frac{4M \cos \theta}{r} \quad (6)$$

If we insert Eq. (5) into Eq. (3), we obtain $$\sigma_o = M \cos \theta \quad (7a)$$
$$\sigma_i = -M \cos \theta \quad (7b)$$

where $\sigma_o$ and $\sigma_i$ are the outer and inner surface charge densities, respectively. Insertion of Eqs. (7a) and (7b) into Coulomb's equation yields zero; consequently, only the volume charge density given by Eq. (6) contributes to the field at the center. If we insert Eq. (6) into Coulomb's equation, we obtain for the working space flux density B $$B = \int_{r_i}^{r_o} \int_0^{\pi} (-4 M \cos \theta)(1/r)(2\pi r^2 \sin \theta)(1/r^2) \cos \theta \, dr \, d\theta \quad (8)$$

$$B = (16/3) \pi M \ln (r_o/r_i), \quad (9)$$

or, if we note that $$4\pi M = B_r, \quad (10)$$

we have $$B = (4/3) B_r \ln (r_o/r_i). \quad (11)$$

This is the same field as that given by a long "magic ring," but enhanced by a factor of 4/3. Also, the sphere is very compact and has no field distortions due to end effects, as does a HCFS.

Figure 2:
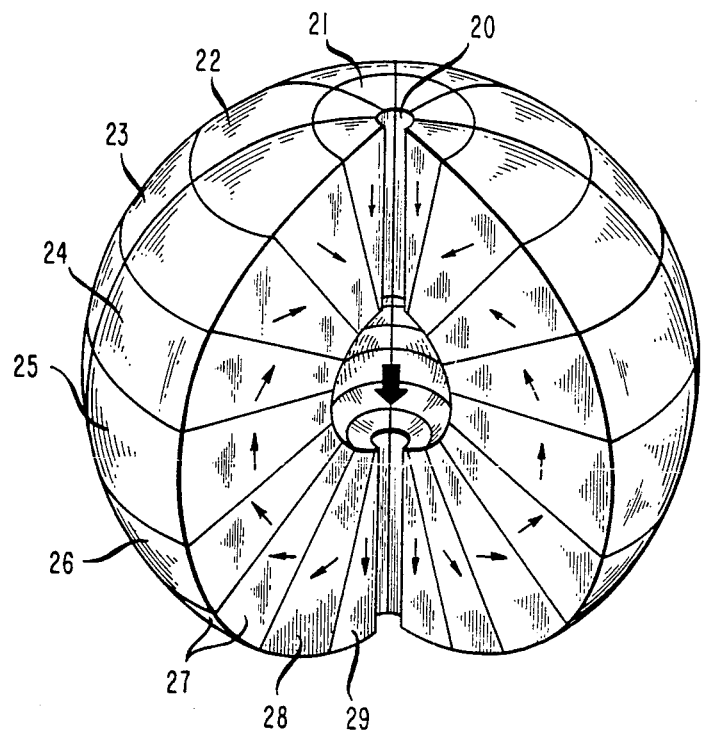
FIG. 2 shows a partially cut-away, practicable approximation to the ideal structure shown in FIG. 1.

Since it is not feasible to construct an ideal HSFS, in practice, a segmented approximation such as that shown in FIG. 2 is used. In such a configuration the magnetization is constant in both magnitude and direction within any one segment. Fortunately, even with as few as eight segments per great circle of longitude, more than 90 per cent of the field of the ideal structure is obtainable. This greatly facilitates construction of a practical device and reduces costs considerably. Azimuthal field dependence is assumed to be continuous.

Considering FIG. 2 now in greater detail, the hollow magnetic sphere is comprised of a series of cones 21-29. Disregarding the bore 20 for the time being, the polar cones 21, 29 are solid, whereas the series of juxtaposed cones 22-28 have the appearance of conical shells. Considering cone 22, by way of example, it is readily seen to be a conical shell whose outer and inner surfaces are both cones. While nine cones have been depicted in FIG. 2, the invention is not so limited and the sphere might comprise a fewer or a larger number of cones. The greater the number of cones the closer the approximation to the ideal case.

Each of the cones 21-29 is segmented along distinct lines of longitudinal meridian(s), as depicted in FIG. 2. It will be evident from FIG. 2 that the cones or conical shells 21 and 22, for example, are each comprised of eight segments (two segments of cones 21 and 22 are not shown due to the partial cut-away). Once again, however, while the cones 21-29 may each be segmented into eight segments, the invention is not so limited and the cones might comprise a fewer or a larger number of segments; the greater the number of segments the closer the approximation to the ideal case.

If a field of 20 kOe is desired in a central cavity of 1.0 cm diameter, and if the magnetic material has a remanence of 12 kG, the outer diameter of the sphere need be only 3.49 cm. The structure would weigh about 0.145 kg, an extraordinarily small mass for so great a field in that volume.

For the field in the central cavity to be useful, accessibility to electrical leads, waveguides, and/or other conduits is required. To this end, the cylindrical bore or hole 20 is drilled axially through the poles. There are instances, however, where a magnetic field transverse to an electron (beam) flow is desirable and in such cases a bore hole concentric with a lateral or normal axis can be used.

Figure 4:
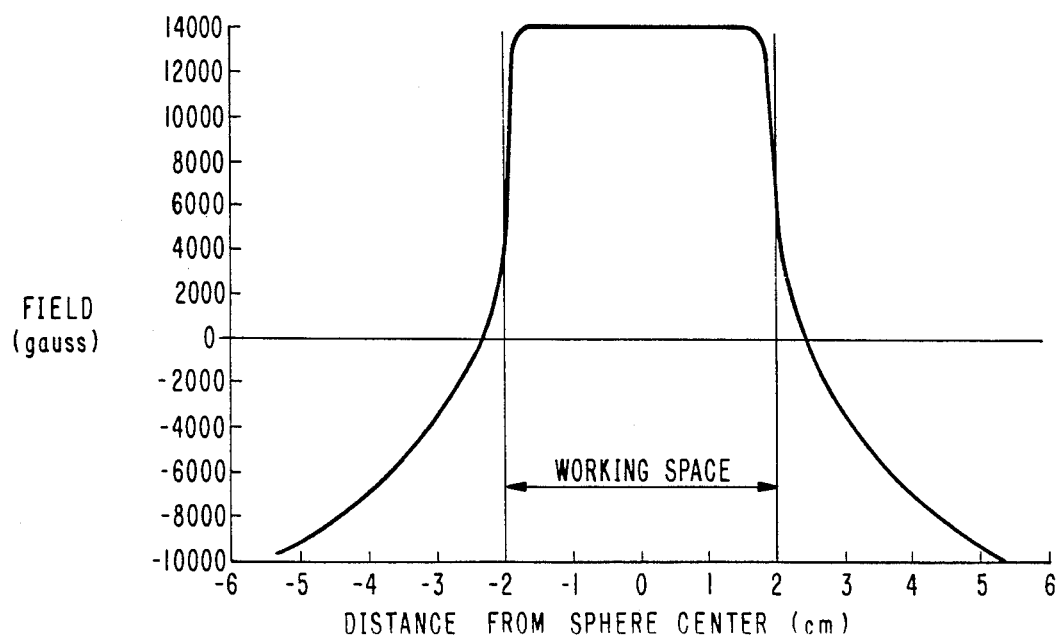
FIG. 4 is a graph useful in illustrating an advantageous feature of the invention.

FIG. 4 shows the on-axis field of a HSFS or magic sphere. The spherical shell thickness is 4 cm, the inner radius is 2 cm, and the magnet remanence is 10 kG. The bore hole or tunnel 20 was varied from 2 to 10 mm hole diameter and substantially the same curve shown in FIG. 4 was obtained in each case. It was found that the magic sphere is very forgiving with regard to holes that are drilled axially through the poles, and which are up to one-fourth the diameter of the central cavity. The only effect of increasing tunnel size appears to be a slight rounding of the initial flat field profile. Therefore, admittance of conduits of any size likely to be needed for a given cavity diameter can be provided with very little field loss. By way of further example, a field of 20 kOe can be generated in a spherical space of radius 1.27 cm by a magic sphere composed of less than 3 kg of material with a remanence of one tesla. This capability can be useful for any application requiring high static fields under severe bulk and weight restrictions.

Figure 3:
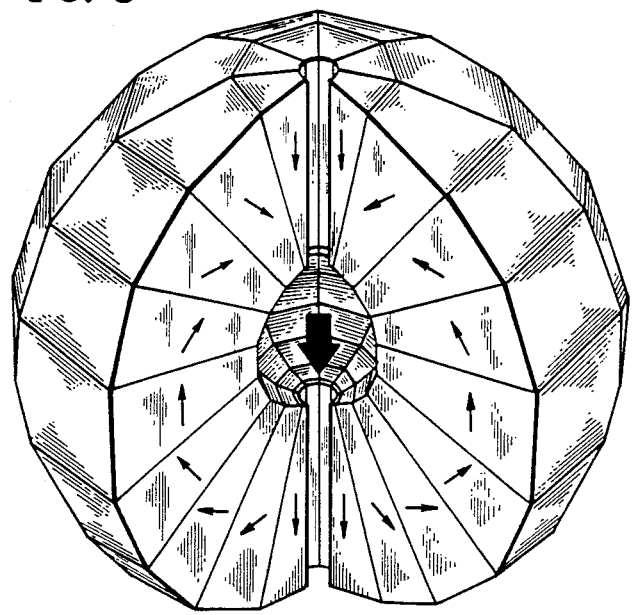
FIG. 3 shows a partially cut-away polyhedron, which is a further approximation to the ideal spherical structure of FIG. 1.

FIG. 3 shows a substantially spherical flux source in the form of a polyhedron. The flux source or "magic sphere" of FIG. 3 corresponds to that of FIG. 2 except the inner and outer surfaces of each segment are flat or planar. The performance of the FIG. 3 structure is closely equivalent to that of FIG. 2, the latter being depicted in FIG. 4. The greater the number of facets of the polyhedron the closer the approximation to the ideal case.

The magnetic material of the segments of the magic sphere(s) may be comprised of $Nd_2 Fe_{14}B$, $SmCo_5$, $PtCo_5$, $Sm_2(CoT)_{17}$ where T is one of the transition metals, and so on. The foregoing materials are characterized by the fact that they maintain their full magnetization to fields larger than their coercivities. These and other equivalent magnetic materials (e.g., selected ferrites) are known to those in the art. Accordingly, it is to be understood that the principles of the present invention are in no way limited to the magnetic material selected for the segments. Also, as known to those skilled in the art, the segments can be pressed to the appropriate shape(s) and magnetized in the desired orientation using any of the known magnetization techniques.

Other and different approximations to the ideal, hollow spherical flux source may occur to those skilled in the art. Accordingly, having shown and described what is at present considered to be several preferred embodiments of the invention, it should be understood that the same has been shown by way of illustration and not limitation. And, all modifications, alterations and changes coming within the spirit and scope of the invention are herein means to be included.

What is claimed is:

1. A permanent magnet structure comprising a hollow substantially spherical magnetic flux source for producing a uniform high-field in its central cavity, said spherical flux source being azimuthally symmetrical in magnetization, the magnetic orientation ($\alpha$) in the substantially spherical magnetic shell being given by:

$$\alpha = 2\theta$$

where $\theta$ is the polar angle.

2. A permanent magnet structure as defined in claim 1 wherein said central cavity is substantially spherical.

3. A permanent magnet structure as defined in claim 2 wherein said spherical flux source has an axial bore hole therethrough.

4. A permanent magnet structure as defined in claim 3 wherein said axial bore hole is drilled through the magnetic poles.

5. A permanent magnet structure as defined in claim 4 wherein said axial bore hole was a diameter up to one-fourth the diameter of said central cavity.

6. A permanent magnet structure as defined in claim 5 wherein the substantially spherical magnetic shell is comprised of a plurality of juxtaposed conical sections, each conical section being segmented along a plurality of distinct lines of longitudinal meridians.

7. A permanent magnet structure as defined in claim 6 wherein the field (H) is said central cavity is given by:

$$H = (4/3)B_r \ln (v_o/v_i)$$

where $B_r$ is the remanence of the magnetic material and $v_o$ and $v_i$ are, respectively, the outer and inner radii of the sphere.

8. A permanent magnet structure as defined in claim 7 wherein said substantially spherical flux source is in the form of a polyhedron having a multiplicity of facets.

* * * * *